United States Patent
Shim (10) Patent No.: US 9,460,812 B1
(45) Date of Patent: Oct. 4, 2016

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventor: Seok Bo Shim, Hwaseong-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/969,046

(22) Filed: Dec. 15, 2015

(30) Foreign Application Priority Data

Aug. 25, 2015 (KR) .................. 10-2015-0119869

(51) Int. Cl.
| | |
|---|---|
| *G11C 7/10* | (2006.01) |
| *G11C 29/12* | (2006.01) |
| *G11C 5/02* | (2006.01) |
| *G11C 7/22* | (2006.01) |

(52) U.S. Cl.
CPC .............. *G11C 29/12* (2013.01); *G11C 5/02* (2013.01); *G11C 7/106* (2013.01); *G11C 7/22* (2013.01)

(58) Field of Classification Search
CPC ......... G11C 11/4076; G11C 11/4082; G11C 11/409; G11C 2207/2254; G11C 29/023; G11C 29/028; G11C 7/1072; G11C 7/22; G11C 7/222; G11C 8/06; G11C 8/18

USPC .......... 365/191, 193, 230.08, 233.1, 233.14, 365/189.07, 233.11, 233.5

See application file for complete search history.

(56) References Cited

U.S. PATENT DOCUMENTS

| | | | |
|---|---|---|---|
| 2011/0084722 A1 | 4/2011 | Nishioka | |
| 2012/0250433 A1* | 10/2012 | Jeon | G11C 8/18 365/193 |

FOREIGN PATENT DOCUMENTS

KR    1020110075347 A    7/2011

* cited by examiner

*Primary Examiner* — Thong Q Le
(74) *Attorney, Agent, or Firm* — William Park & Associates Ltd.

(57) ABSTRACT

A semiconductor system includes a first semiconductor device and a second semiconductor device. The first semiconductor device outputs a first test start signal and a second test start signal. The second semiconductor device includes a first chip and a second chip which are sequentially stacked. The first chip selectively outputs first failure information generated in response to the first test start signal as first selection data, in response to the second test start signal. The second chip selectively outputs second failure information generated in response to the first test start signal as second selection data, in response to the second test start signal.

20 Claims, 11 Drawing Sheets

FIG. 11

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Patent Application No. 10-2015-0119869, filed on Aug. 25, 2015, in the Korean Intellectual Property Office, which is incorporated herein by reference in its entirety as set forth in full.

BACKGROUND

1. Technical Field

Embodiments of the present disclosure relate to semiconductor devices having a three dimensional structure and semiconductor systems including the same.

2. Related Art

Recently, three dimensional semiconductor devices have been fabricated to increase the integration density thereof. The three dimensional semiconductor devices may include a plurality of semiconductor chips which are stacked. The plurality of semiconductor chips may be electrically connected to each other by through silicon vias (TSVs) that vertically penetrate the plurality of semiconductor chips. The semiconductor chips included in each three dimensional semiconductor device may receive address signals, command signals, and other signals for entering a test mode and executing a test operation through the TSVs, and the semiconductor chips may output signals and/or data that include some pieces of information. The plurality of semiconductor chips included in each three dimensional semiconductor device may transmit signals to each other through the TSVs. In such a case, lengths of signal paths between the semiconductor device and a controller for controlling the semiconductor device may be reduced to prevent degrading of a signal transmission speed between the semiconductor device and the controller.

After the three dimensional semiconductor devices are fabricated, the three dimensional semiconductor devices have to be tested to confirm whether the three dimensional semiconductor devices operate normally. When a semiconductor device has a plurality of stacked semiconductor chips, it may be important to reduce the test time of the plurality of stacked semiconductor chips without degrading the test reliability. This is because the test time affects the fabrication cost of the semiconductor device. Thus, a lot of effort has been focused on developing a method of reducing the test time of the three dimensional semiconductor devices including TSVs without degrading test reliability.

SUMMARY

Various embodiments are directed to semiconductor devices having a three dimensional structure and semiconductor systems including the same.

According to an embodiment, a semiconductor system includes a first semiconductor device and a second semiconductor device. The first semiconductor device outputs a first test start signal and a second test start signal. The second semiconductor device includes a first chip and a second chip which are sequentially stacked. The first chip selectively outputs first failure information generated in response to the first test start signal as first selection data, in response to the second test start signal. The second chip selectively outputs second failure information generated in response to the first test start signal as second selection data, in response to the second test start signal.

According to another embodiment, a semiconductor device includes a first chip, a second chip and a third chip which are sequentially stacked. A first connection portion and a second connection portion penetrate the first, second and third chips. In response to a second test start signal the first chip selectively generates first failure information in response to a first test start signal as first selection data. In response to the second test start signal the second chip is selectively generates second failure information in response to the first test start signal as second selection data. In response to the second test start signal the third chip selectively generates third failure information in response to the first test start signal as third selection.

According to yet another embodiment, a semiconductor device includes a first chip, a second chip and a third chip which are sequentially stacked. A first connection portion and a second connection portion penetrating the first, second and third chips. The first chip generates first selection data from first failure information, the second chip generates second selection data from second failure information, and the third chip generates third selection data from third failure information. The first chip receives the second selection data through the first connection portion and receives the third selection data through the second connection portion. The first chip converts the first, second and third selection data into serial data to output the serial data as transmission data, in response to a read signal which is enabled to execute a read operation.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit a scope of the present disclosure.

Figure 1:
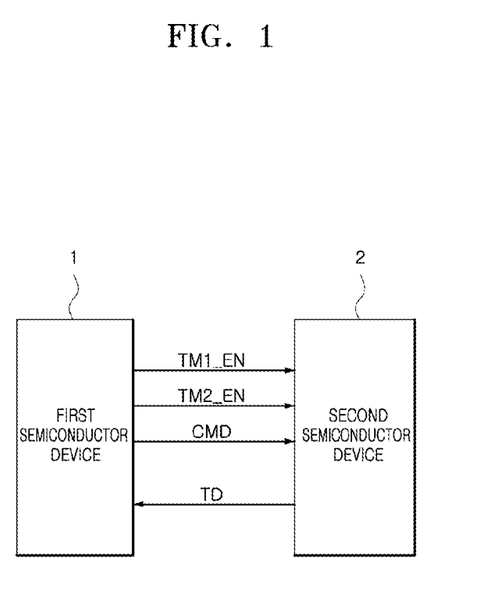
FIG. 1 is a block diagram illustrating a configuration of a semiconductor system according to an embodiment.

As illustrated in FIG. 1, a semiconductor system according to an embodiment may include a first semiconductor device 1 and a second semiconductor device 2.

The first semiconductor device 1 may output a first test start signal TM1_EN, a second test start signal TM2_EN and a command CMD. The first test start signal TM1_EN may be enabled to execute a test for verifying a normality/abnormality of each memory cell array included in the second semiconductor device 2. That is, the first test start signal TM1_EN may be enabled to execute a test for verifying whether the memory cell arrays included in the second semiconductor device 2 operate normally. The second test start signal TM2_EN may be enabled to output failure information of the tested memory cell arrays. The command CMD may be applied to the second semiconductor device 2 to execute a read operation or the like. The command CMD may include signals having a plurality of bits and may be transmitted through a transmission line that transmits addresses. In some embodiments, the first and second test start signals TM1_EN and TM2_EN may be included in the command CMD and may be transmitted together with the command CMD.

The second semiconductor device 2 may receive the first test start signal TM1_EN to execute a test operation for verifying whether memory cell arrays in the second semiconductor device 2 operate normally. The second semiconductor device 2 may receive the second test start signal TM2_EN and the command CMD to output failure information of the tested memory cell arrays as transmission data TD. The first semiconductor device 1 may receive the transmission data TD and confirm whether the memory cell arrays in the second semiconductor device 2 operate normally.

Figure 2:
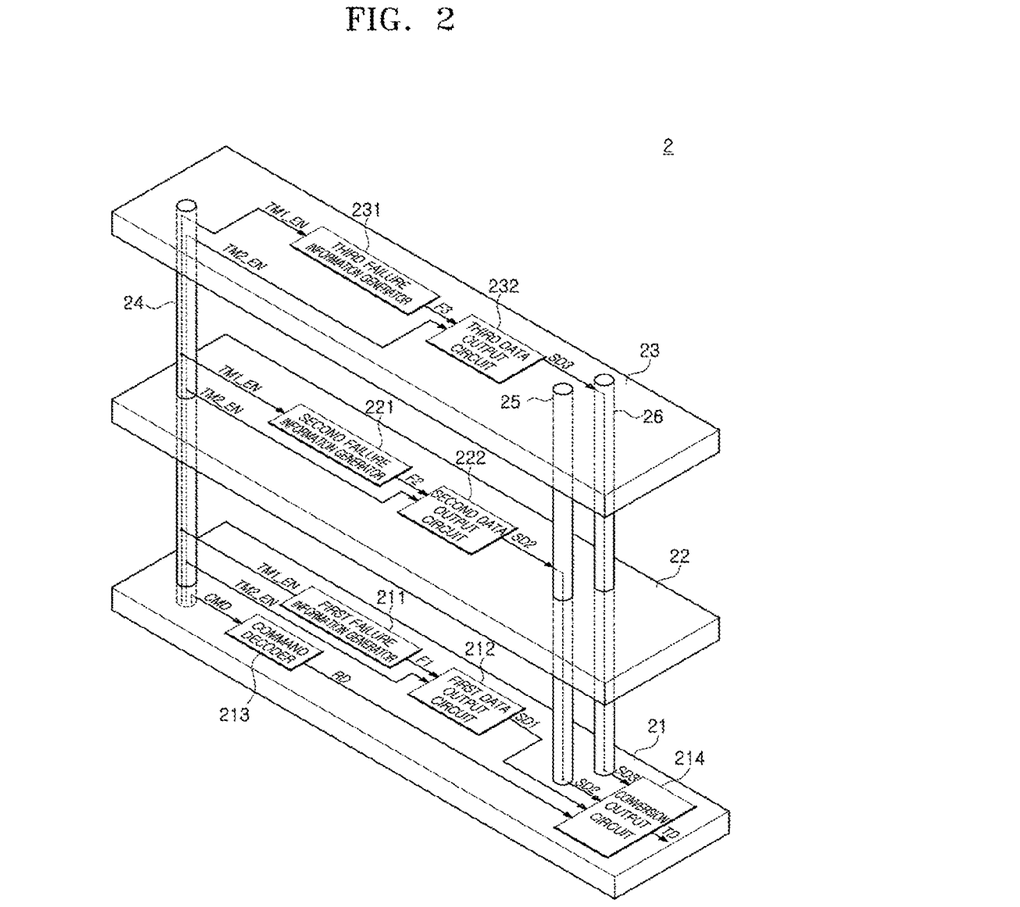
FIG. 2 is an exploded perspective view illustrating a configuration of a second semiconductor device included in the semiconductor system of FIG. 1.

Referring to FIG. 2, the second semiconductor device 2 may include a first chip 21, a second chip 22, a third chip 23, a first connection element 24, a second connection element 25 and a third connection element 26. The first chip 21, the second chip 22 and the third chip 23 may be sequentially stacked on one another. Further, one or more of the first connection element 24, the second connection element 25 and the third connection element 26 penetrates the first, second and third chips 21, 22 and 23. The first chip 21 may include a first failure information generator 211, a first data output circuit 212, a command decoder 213 and a conversion output circuit 214. The second chip 22 may include a second failure information generator 221 and a second data output circuit 222. The third chip 23 may include a third failure information generator 231 and a third data output circuit 232. The first, second and third connection elements 24, 25 and 26 may electrically connect the first, second and third chips 21, 22 and 23 to each other and provide signal paths through which signals are transmitted. The first, second and third connection elements 24, 25 and 26 may be realized using through silicon vias (TSVs). The first test start signal TM1_EN, the second test start signal TM2_EN and the command CMD may be inputted to the second semiconductor device 2 through the first connection element 24. Second selection data SD2 may be transmitted from the second chip 22 to the first chip 21 through the second connection element 25. Third selection data SD3 may be transmitted from the third chip 23 to the first chip 21 through the third connection element 26.

The first failure information generator 211 may execute a test confirming whether a first memory cell array operates normally, where the test is executed in response to the first test start signal TM1_EN and the first failure information generator 211 may generate first failure information F1. More specifically, the first failure information generator 211 may execute a compressive parallel test to generate the first failure information F1 if the first test start signal TM1_EN is enabled. The comprehensive parallel test may include information on the normality/abnormality of the first memory cell array. The compressive parallel test may also be executed by writing data into the first memory cell array and by compressing and reading the data stored in the first memory cell array. The first failure information generator 211 may include circuits for executing the compressive parallel test. A logic level of an enabled first test start signal TM1_EN may be set according to the embodiments.

The first data output circuit 212 may selectively output the first failure information F1 as first selection data SD1 in response to the second test start signal TM2_EN. More specifically, the first data output circuit 212 may selectively output the first failure information F1 latched and stored therein as the first selection data SD1 if the second test start signal TM2_EN is enabled. A logic level of an enabled second test start signal TM2_EN may be set according to an embodiment.

The command decoder 213 may decode the command CMD to generate a read signal RD. The read signal RD may be enabled to execute a read operation. A logic level of an enabled read signal RD may be set according to an embodiment.

The conversion output circuit 214 may sequentially output the first selection data SD1, the second selection data SD2 and the third selection data SD3 as the transmission data TD in response to the read signal RD. More specifically, if the read signal RD is enabled, the conversion output circuit 214 may convert the first, second and third selection data SD1, SD2 and SD3 that are inputted in parallel into serial data and may output the serial data as the transmission data TD in response to the read signal RD. The second selection data SD2 may be inputted to the conversion output circuit 214 through the second connection element 25, and the third selection data SD3 may be inputted to the conversion output circuit 214 through the third connection element 26.

The second failure information generator 221 may execute a test for confirming whether or not a second memory cell array operates normally in response to the first test start signal TM1_EN and the second failure information generator 221 may generate second failure information F2. More specifically, the second failure information generator 221 may execute a compressive parallel test to generate the second failure information F2 if the first test start signal TM1_EN is enabled. The compressive parallel test may be executed by writing data into the second memory cell array and by compressing and reading the data stored in the second memory cell array. The second failure information generator 221 may include circuits for executing the compressive parallel test. A logic level of an enabled first test start signal TM1_EN may be set to according to an embodiment.

The second data output circuit 222 may output the second failure information F2 as second selection data SD2 in response to the second test start signal TM2_EN. More specifically, the second data output circuit 222 may selectively output the second failure information F2 latched and stored therein as the second selection data SD2 if the second test start signal TM2_EN is enabled. A logic level of an enabled second test start signal TM2_EN may be set according to an embodiment.

The third failure information generator 231 may execute a test for confirming whether or not a third memory cell array operates normally in response to the first test start signal TM1_EN and may generate third failure information F3. More specifically, the third failure information generator 231 may execute a compressive parallel test to generate the third failure information F3 if the first test start signal TM1_EN is enabled. The compressive parallel test may be executed by writing data into the third memory cell array and by compressing and reading the data stored in the third memory cell array. The third failure information generator 231 may include circuits for executing the compressive parallel test. A logic level of an enabled first test start signal TM1_EN may be set to according to an embodiment.

The third data output circuit 232 may output the third failure information F3 as third selection data SD3 in response to the second test start signal TM2_EN. More specifically, the third data output circuit 232 may selectively output the third failure information F3 latched and stored therein as the third selection data SD3 if the second test start signal TM2_EN is enabled. A logic level of an enabled second test start signal TM2_EN may be set according to an embodiment.

Figure 3:
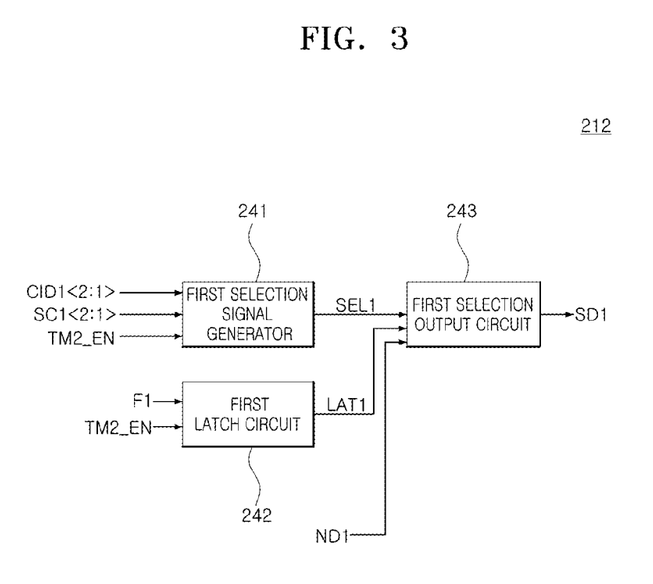
FIG. 3 is a block diagram illustrating a configuration of a first data output circuit included in the second semiconductor device of FIG. 2.

Referring to FIG. 3, the first data output circuit 212 may include a first selection signal generator 241, a first latch circuit 242 and a first selection output circuit 243.

The first selection signal generator 241 may generate a first selection signal SEL1 in response to a first chip identification signal CID1<2:1>, a first set code SC1<2:1> and the second test start signal TM2_EN. More specifically, if the second test start signal TM2_EN is enabled while a logic level combination of the first chip identification signal CID1<2:1> is equal to or coincident with a logic level combination of the first set code SC1<2:1>, the first selection signal generator 241 may generate the first selection signal SEL1 which is enabled. The logic level combination of the first chip identification signal CID1<2:1> may be set so that the first chip identification signal CID1<2:1> is an identification signal of the first chip 21. The logic level combination of the first chip identification signal CID1<2:1> may be set after a section for an initialization operation of the second semiconductor device 2, for example, a power-up section terminates. In some embodiments, the logic level combination of the first chip identification signal CID1<2:1> may be set during a mode register set (MRS) operation. The first set code SC1<2:1> may have a fixed logic level combination corresponding to the first chip 21. If the first chip identification signal CID1<2:1> is set to have a logic level combination of 'L, H' and the second test start signal TM2_EN is enabled while the first set code SC1<2:1> is set to have a logic level combination of 'L, H', the first selection signal generator 241 may generate an enabled first selection signal SEL1. In the first set code SC1<2:1>, a logic level combination of 'L, H' means that a second bit SC1<2> of the first set code SC1<2:1> has a logic "low" level and a first bit SC1<1> of the first set code SC1<2:1> has a logic "high" level. Similarly, in the first chip identification signal CID1<2:1>, a logic level combination of 'L, H' means that a second bit CID1<2> of the first chip identification signal CID1<2:1> has a logic "low" level and a first bit CID1<1> of the first chip identification signal CID1<2:1> has a logic "high" level. When the first chip identification signal CID1<2:1> is initialized to have a logic level combination of 'L, L', the first chip identification signal CID1<2:1> may be set to have a logic level combination of 'L, H' after a section for an initialization operation of the second semiconductor device 2 terminates.

The first latch circuit 242 may receive and latch the first failure information F1. The first latch circuit 242 may generate a first latch signal LAT1 in response to the second test start signal TM2_EN. More specifically, the first latch circuit 242 may latch the first failure information F1 and may output the latched first failure information F1 as the first latch signal LAT1 if the second test start signal TM2_EN is enabled.

The first selection output circuit 243 may selectively output the first latch signal LAT1 or first normal data ND1 as the first selection data SD1 in response to the first selection signal SEL1, where the first selection signal SEL1 is generated in response to the second test start signal TM2_EN. More specifically, the first selection output circuit 243 may selectively output the first latch signal LAT1 as the first selection data SD1 if the first selection signal SEL1 is enabled and may selectively output the first normal data ND1 as the first selection data SD1 if the first selection signal SEL1 is disabled. The first normal data ND1 may be generated from data stored in the first memory cell array included in the first chip 21 if the read operation is executed while the second test start signal TM2_EN is disabled.

Figure 4:
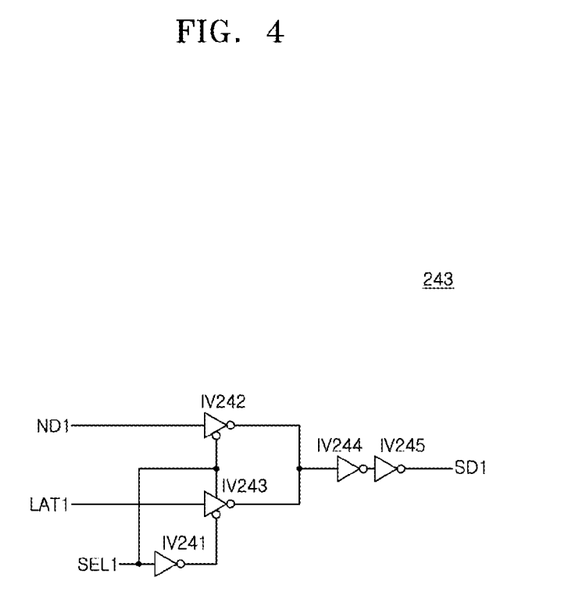
FIG. 4 is a logic circuit diagram illustrating a configuration of a first selection output circuit included in the first data output circuit of FIG. 3.

Referring to FIG. 4, the first selection output circuit 243 may include inverters IV241, IV242, IV243, IV244 and IV245.

The first selection output circuit 243 may inversely buffer the first latch signal LAT1 through the cascaded inverters IV243, IV244 and IV245 to generate the first selection data SD1 if the first selection signal SEL1 is enabled to have a logic "high" level. The first selection output circuit 243 may inversely buffer the first normal data ND1 through the cascaded inverters IV242, IV244 and IV245 to generate the first selection data SD1 if the first selection signal SEL1 is disabled to have a logic "low" level.

Figure 5:
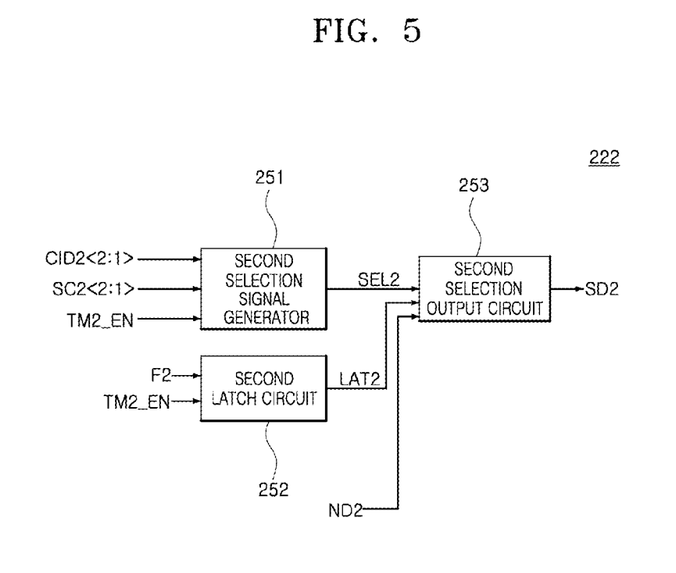
FIG. 5 is a block diagram illustrating a configuration of a second data output circuit included in the second semiconductor device of FIG. 2.

Referring to FIG. 5, the second data output circuit 222 may include a second selection signal generator 251, a second latch circuit 252 and a second selection output circuit 253.

The second selection signal generator 251 may generate a second selection signal SEL2 in response to a second chip identification signal CID2<2:1>, a second set code SC2<2:1> and the second test start signal TM2_EN. More specifically, if the second test start signal TM2_EN is enabled while a logic level combination of the second chip identification signal CID2<2:1> is equal to or coincident with a logic level combination of the second set code SC2<2:1>, the second selection signal generator 251 may generate an enabled second selection signal SEL2. The logic level combination of the second chip identification signal CID2<2:1> may be set so that the second chip identification signal CID2<2:1> is an identification signal of the second chip 22. The logic level combination of the second chip identification signal CID2<2:1> may be after the section for the initialization operation of the second semiconductor device 2, for example, the power-up section terminates. In some embodiments, the logic level combination of the second chip identification signal CID2<2:1> may be set during the mode register set (MRS) operation. The second set code SC2<2:1> may have a fixed logic level combination corresponding to the second chip 22. If the second chip identification signal CID2<2:1> is set to have a logic level combination of 'H, L' and the second test start signal TM2_EN is enabled while the second set code SC2<2:1> is set to have a logic level combination of 'H, L', the second selection signal generator 251 may generate an enabled second selection signal SEL2. In the second set code SC2<2:1>, a logic level combination of 'H, L' means that a second bit SC2<2> of the second set code SC2<2:1> has a logic "high" level and a first bit SC2<1> of the second set code SC2<2:1> has a logic "low" level. Similarly, in the second chip identification signal CID2<2:1>, a logic level combination of 'H, L' means that a second bit CID2<2> of the second chip identification signal CID2<2:1> has a logic "high" level and a first bit CID2<1> of the second chip identification signal CID2<2:1> has a logic "low" level. When the second chip identification signal CID2<2:1> is initialized to have a logic level combination of 'L, L', the second chip identification signal CID2<2:1> may be set to have a logic level combination of 'H, L' after a section for an initialization operation of the second semiconductor device 2 terminates.

The second latch circuit 252 may receive and latch the second failure information F2. The second latch circuit 252 may generate a second latch signal LAT2 in response to the second test start signal TM2_EN. More specifically, the second latch circuit 252 may latch the second failure information F2 and may output the latched second failure information F2 as the second latch signal LAT2 if the second test start signal TM2_EN is enabled.

The second selection output circuit 253 may selectively output the second latch signal LAT2 or second normal data ND2 as the second selection data SD2 in response to the second selection signal SEL2, where the second selection signal SEL2 is generated in response to the second test start signal TM2_EN. More specifically, the second selection output circuit 253 may selectively output the second latch signal LAT2 as the second selection data SD2 if the second selection signal SEL2 is enabled and may selectively output the second normal data ND2 as the second selection data SD2 if the second selection signal SEL2 is disabled. The second normal data ND2 may be generated from data stored in the second memory cell array included in the second chip 22 if the read operation is executed while the second test start signal TM2_EN is disabled.

Figure 6:
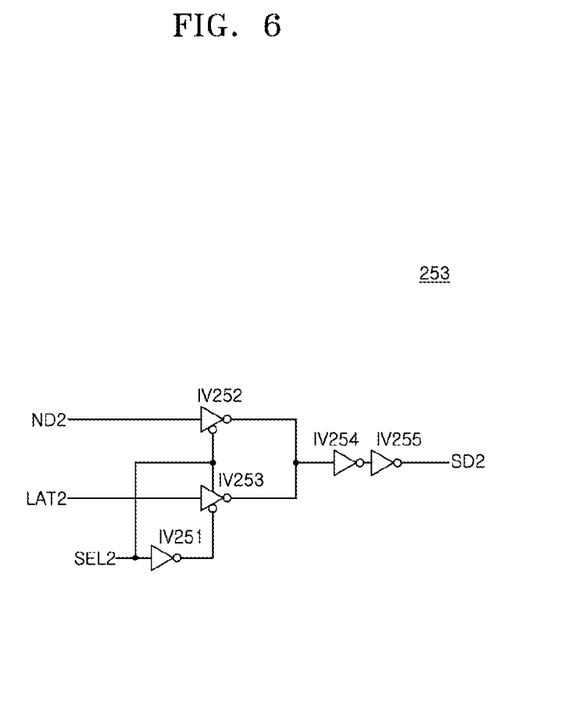
FIG. 6 is a logic circuit diagram illustrating a configuration of a second selection output circuit included in the second data output circuit of FIG. 5.

Referring to FIG. 6, the second selection output circuit 253 may include inverters IV251, IV252, IV253, IV254 and IV255.

The second selection output circuit 253 may inversely buffer the second latch signal LAT2 through the cascaded inverters IV253, IV254 and IV255 to generate the second selection data SD2 if the second selection signal SEL2 is enabled to have a logic "high" level. The second selection output circuit 253 may inversely buffer the second normal data ND2 through the cascaded inverters IV252, IV254 and IV255 to generate the second selection data SD2 if the second selection signal SEL2 is disabled to have a logic "low" level.

Figure 7:
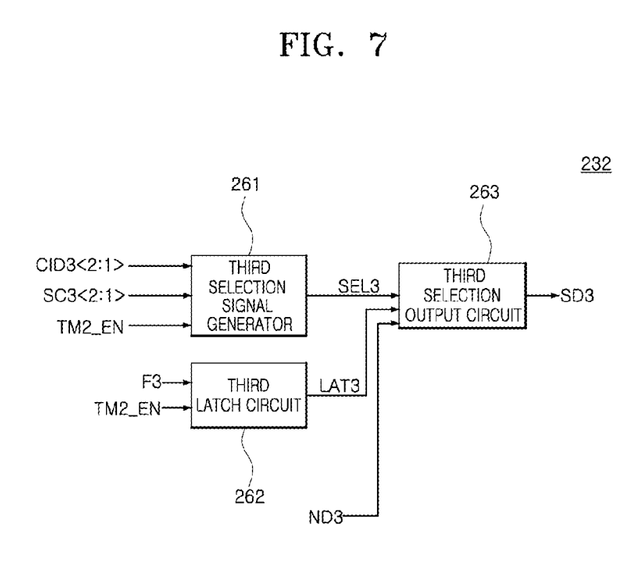
FIG. 7 is a block diagram illustrating a configuration of a third data output circuit included in the second semiconductor device of FIG. 2.

Referring to FIG. 7, the third data output circuit 232 may include a third selection signal generator 261, a third latch circuit 262 and a third selection output circuit 263.

The third selection signal generator 261 may generate a third selection signal SEL3 in response to a third chip identification signal CID3<2:1>, a third set code SC3<2:1> and the second test start signal TM2_EN. More specifically, if the second test start signal TM2_EN is enabled while a logic level combination of the third chip identification signal CID3<2:1> is equal to or coincident with a logic level combination of the third set code SC3<2:1>, the third selection signal generator 261 may generate an enabled third selection signal SEL3. The logic level combination of the third chip identification signal CID3<2:1> may be set so that the third chip identification signal CID3<2:1> is an identification signal of the third chip 23. The logic level combination of the third chip identification signal CID3<2:1> may be set after the section for the initialization operation of the second semiconductor device 2, for example, the power-up section terminates. In some embodiments, the logic level combination of the third chip identification signal CID3<2:1> may be set during the mode register set (MRS) operation. The third set code SC3<2:1> may have a fixed logic level combination corresponding to the third chip 23. If the third chip identification signal CID3<2:1> is set to have a logic level combination of 'H, H' and the second test start signal TM2_EN is enabled while the third set code SC3<2:1> is set to have a logic level combination of 'H, H', the third selection signal generator 261 may generate an enabled third selection signal SEL3. In the third set code SC3<2:1>, a logic level combination of 'H, H' means that a second bit SC3<2> of the third set code SC3<2:1> has a logic "high" level and a first bit SC3<1> of the third set code SC3<2:1> has a logic "high" level. Similarly, in the third chip identification signal CID3<2:1>, the logic level combination of 'H, H' means that a second bit CID3<2> of the third chip identification signal CID3<2:1> has a logic "high" level and a first bit CID3<1> of the third chip identification signal CID3<2:1> has a logic "high" level. When the third chip identification signal CID3<2:1> is initialized to have a logic level combination of 'L, L', the third chip identification signal CID3<2:1> may be set to have a logic level combination of 'H, H' after a section for an initialization operation of the second semiconductor device 2 terminates.

The third latch circuit 262 may receive and latch the third failure information F3. The third latch circuit 262 may generate a third latch signal LAT3 in response to the second test start signal TM2_EN. More specifically, the third latch circuit 262 may latch the third failure information F3 and may output the latched third failure information F3 as the third latch signal LAT3 if the second test start signal TM2_EN is enabled.

The third selection output circuit 263 may selectively output the third latch signal LAT3 or third normal data ND3 as the third selection data SD3 in response to the third selection signal SEL3, where the third selection signal SEL3 is generated in response to the second test start signal TM2_EN. More specifically, the third selection output circuit 263 may selectively output the third latch signal LAT3 as the third selection data SD3 if the third selection signal SEL3 is enabled and may selectively output the third normal data ND3 as the third selection data SD3 if the third selection signal SEL3 is disabled. The third normal data ND3 may be generated from data stored in the third memory cell array included in the third chip 23 if the read operation is executed while the second test start signal TM2_EN is disabled.

Figure 8:
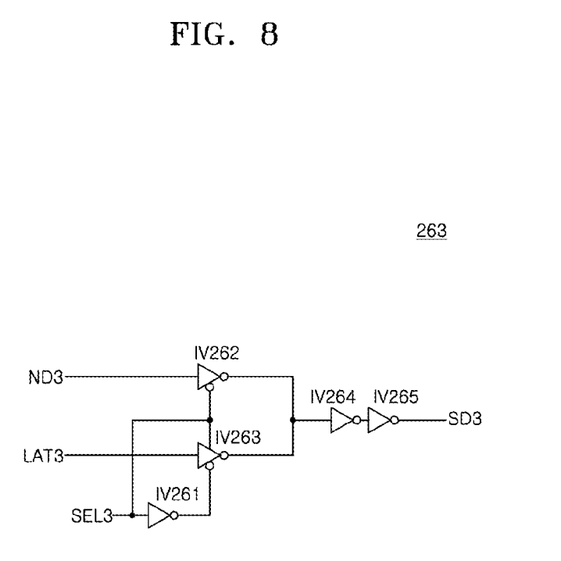
FIG. 8 is a logic circuit diagram illustrating a configuration of a third selection output circuit included in the third data output circuit of FIG. 7.

Referring to FIG. 8, the third selection output circuit 263 may include inverters IV261, IV262, IV263, IV264 and IV265.

The third selection output circuit 263 may inversely buffer the third latch signal LAT3 through the cascaded inverters IV263, IV264 and IV265 to generate the third selection data SD3 if the third selection signal SEL3 is enabled to have a logic "high" level. The third selection output circuit 263 may inversely buffer the third normal data ND3 through the cascaded inverters IV262, IV264 and IV265 to generate the third selection data SD3 if the third selection signal SEL3 is disabled to have a logic "low" level.

Figure 9:
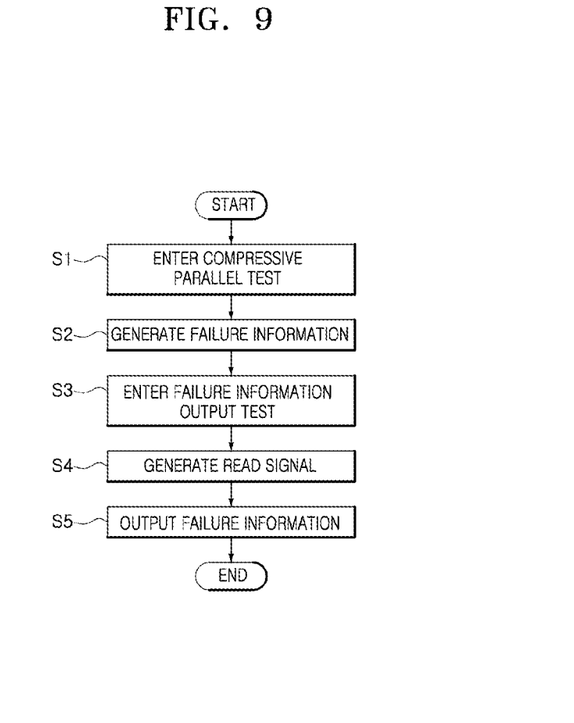
FIG. 9 is a flowchart illustrating a test operation of the semiconductor system shown in FIGS. 1 to 8.

An operation of testing the semiconductor system having the aforementioned configuration will be described hereinafter with reference to FIG. 9.

If the first test start signal TM1_EN is enabled, the second semiconductor device 2 may enter a compressive parallel test mode for confirming whether memory cell arrays included in the second semiconductor device 2 operates normally (see a step S1).

As a result of the compressive parallel test, in response to a second test start signal TM2_EN the first chip 21 included in the second semiconductor device 2 may selectively generate first failure information F1 in response to a first test start signal TM1_EN as first selection data SD1. Also, in response to a second test start signal TM2_EN the second chip 22 included in the second semiconductor device 2 may selectively generate second failure information F2 in response to a first test start signal TM1_EN as second selection data SD2. Further, in response to a second test start signal TM2_EN the third chip 23 included in the second semiconductor device 2 may selectively generate third failure information F3 in response to a first test start signal TM1_EN as second selection data SD3 (see a step S2).

If the second test start signal TM2_EN is enabled, the second semiconductor device 2 may enter a failure information output test mode for outputting the first failure information F1, the second failure information F2 and the third failure information F3 (see a step of S3). The first failure information F1 may be outputted as the first selection data SD1 by the first chip 21, the second failure information F2 may be outputted as the second selection data SD2 by the second chip 22, and the third failure information F3 may be outputted as the third selection data SD3 by the third chip 23.

In the failure information output test mode, the command CMD may be decoded to generate the read signal RD which is enabled for execution of a read operation (see a step of S4).

If the read signal RD is enabled, the first, second and third selection data SD1, SD2 and SD3 which are inputted in parallel, may be converted into serial data. The serial data may be outputted as the transmission data TD (see a step S5).

According to the semiconductor system described with reference to FIGS. 1 to 9, if the second test start signal TM2_EN is enabled, the second selection data SD2 may be transmitted to the first chip 21 through the second connection element 25 and the third selection data SD3 may be transmitted to the first chip 21 through the third connection element 26. In addition, the semiconductor system may convert the first, second and third selection data SD1, SD2 and SD3, inputted in parallel, into serial data and the semiconductor system may output the serial data as the transmission data TD. That is, the first, second and third failure information F1, F2 and F3 of the first, second and third chips 21, 22 and 23 may be outputted by a single test operation. Further, the first, second and third chips 21, 22, and 23 may be stacked to have a three dimensional structure. As a result, a test time of the second semiconductor device 2 may be reduced and lowers the fabrication cost of the semiconductor system.

Figure 10:
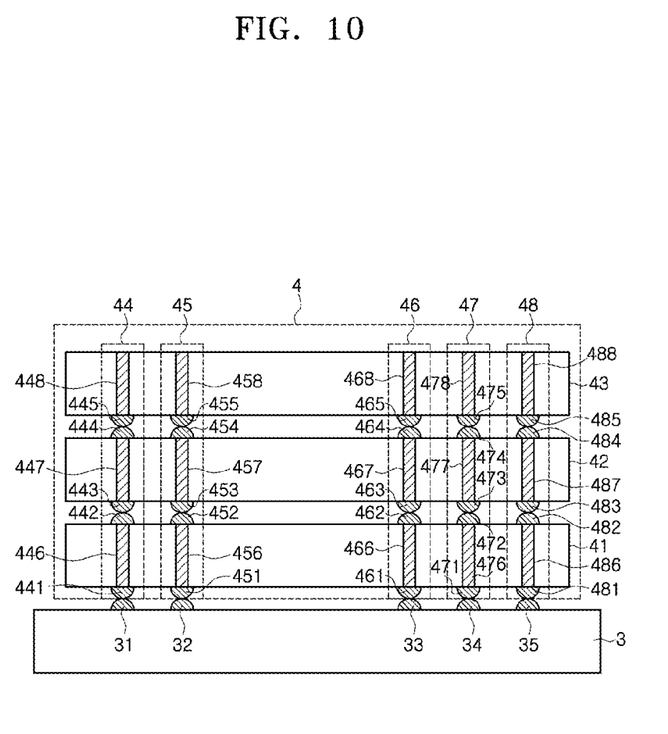
FIG. 10 is a cross-sectional view illustrating another second semiconductor device with which the second semiconductor device of FIG. 2 is replaced.

As illustrated in FIG. 10, a semiconductor system according to another embodiment may include a third semiconductor device 3 and a fourth semiconductor device 4.

The third semiconductor device 3 may include bump pads 31, 32, 33, 34 and 35. The bump pads 31, 32, 33, 34 and 35 of the third semiconductor device 3 may be electrically connected to bump pads 441, 451, 461, 471 and 481 of the fourth semiconductor device 4, respectively. The third semiconductor device 3 may apply signals (e.g., the first test start signal TM1_EN, the second test start signal TM2_EN, the command CMD of FIG. 1) to the fourth semiconductor device 4 through the bump pads 31, 32, 33, 34, 35, 441, 451, 461, 471 and 481. The fourth semiconductor device 4 may apply data (e.g., the transmission data TD of FIG. 1) to the third semiconductor device 3 through the bump pads 31, 32, 33, 34, 35, 441, 451, 461, 471 and 481.

The fourth semiconductor device 4 may include a fourth chip 41, a fifth chip 42, a sixth chip 43, a first connection portion 44, a second connection portion 45, a third connection portion 46, a fourth connection portion 47 and a fifth connection portion 48. The first connection portion 44 may include bump pads 441, 442, 443, 444 and 445, and connection elements 446, 447 and 448. The second connection portion 45 may include bump pads 451, 452, 453, 454 and 455, and connection elements 456, 457 and 458. The third connection portion 46 may include bump pads 461, 462, 463, 464 and 465, and connection elements 466, 467 and 468. The fourth connection portion 47 may include bump pads 471, 472, 473, 474 and 475, and connection elements 476, 477 and 478. The fifth connection portion 48 may include bump pads 481, 482, 483, 484 and 485, and connection elements 486, 487 and 488. The first test start signal TM1_EN, the second test start signal TM2_EN and the command CMD may be transmitted through at least one of the first, second, third, fourth and fifth connection portions 44, 45, 46, 47 and 48. In addition, selection data generated from failure information generated from the fifth and sixth chips 42 and 43 may be transmitted to, for example, the fourth chip 41 through at least one of the first, second, third, fourth and fifth connection portions 44, 45, 46, 47 and 48. Further, at least one of the first, second, third, fourth and fifth connection portions 44, 45, 46, 47 and 48 may penetrate the fourth, fifth and sixth chips 41, 42 and 43.

The third semiconductor chip 3 may be realized to have the same configuration as the first semiconductor chip 1 described with reference to FIG. 1, and the fourth semiconductor chip 4 may be realized to have the same configuration as the second semiconductor chip 2 described with reference to FIG. 1.

Figure 11:
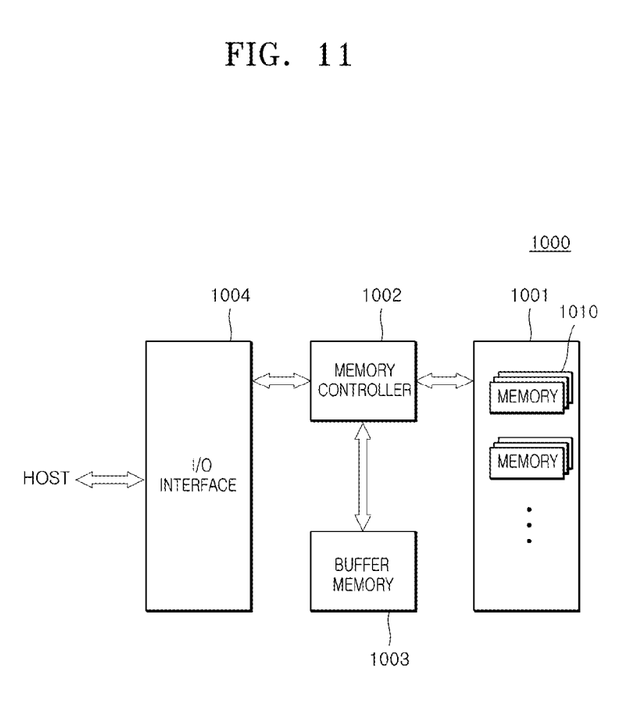
FIG. 11 is a block diagram illustrating an electronic system including at least one of the semiconductor devices or the semiconductor systems shown in FIGS. 1 to 10.

At least one of the semiconductor devices or at least one of the semiconductor systems described with reference to FIGS. 1 to 10 may be applied to an electronic system that includes a memory system, a graphic system, a computing system, a mobile system, or the like. For example, an electronic system 1000 according an embodiment may include a data storage circuit 1001, a memory controller 1002, a buffer memory 1003, and an input/output (I/O) interface 1004, as illustrated in FIG. 11.

The data storage circuit 1001 may include a plurality of memory cell arrays 1010 including at least a first memory cell array, a second memory cell array and a third memory cell array, may store data which is outputted from the memory controller 1002 or may read and output the stored data to the memory controller 1002, according to a control signal generated from the memory controller 1002. The data storage circuit 1001 may include the second semiconductor device 2 illustrated in FIG. 1 or the fourth semiconductor device 4 illustrated in FIG. 10. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), and the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. The memory controller 1002 may include the first semiconductor device 1 illustrated in FIG. 1 or the third semiconductor device 3 illustrated in FIG. 10. Although FIG. 11 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store the data which is outputted from or inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004, and may output data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), an integrated drive electronics (IDE), and the like.

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, and the like.

What is claimed is:

1. A semiconductor system comprising:
a first semiconductor device suitable for outputting a first test start signal and a second test start signal; and
a second semiconductor device including a first chip and a second chip which are sequentially stacked,
wherein the first chip is suitable for selectively outputting first failure information generated in response to the first test start signal as first selection data in response to the second test start signal,
wherein the second chip is suitable for selectively outputting second failure information generated in response to the first test start signal as second selection data in response to the second test start signal,
wherein the first chip includes a first failure information generator suitable for generating the first failure information including information on a normality/abnormality of a first memory cell array in response to the first test start signal.

2. The semiconductor system of claim 1, wherein the first chip further includes:
a first data output circuit suitable for selectively outputting the first failure information as the first selection data in response to the second test start signal.

3. The semiconductor system of claim 2, wherein the first data output circuit includes:
a latch circuit suitable for latching the first failure information and suitable for outputting the latched first failure information as a first latch signal in response to the second test start signal; and
a selection output circuit suitable for selectively outputting the first latch signal or first normal data as the first selection data in response to a selection signal generated in response to the second test start signal.

4. The semiconductor system of claim 3, wherein the first data output circuit further includes a selection signal generator suitable for generating the selection signal in response to the second test start signal while a chip identification signal and a set code are equal.

5. The semiconductor system of claim 2, wherein the first chip further includes:
a command decoder suitable for decoding a command to generate a read signal which is enabled to execute a read operation; and
a conversion output circuit suitable for converting at least the first selection data and the second selection data into serial data to output the serial data as transmission data in response to the read signal.

6. The semiconductor system of claim 2, wherein the second chip includes:
a second failure information generator suitable for generating the second failure information including information on a normality/abnormality of a second memory cell array in response to the first test start signal; and
a second data output circuit suitable for selectively outputting the second failure information as the second selection data in response to the second test start signal.

7. The semiconductor system of claim 1,
wherein the second semiconductor device further includes a third chip stacked on the second chip; and
wherein the third chip is suitable for selectively outputting third failure information generated in response to the first test start signal as third selection data in response to the second test start signal.

8. The semiconductor system of claim 7, wherein the second semiconductor device further includes a first connection element and a second connection element that penetrates the first, second and third chips.

9. The semiconductor system of claim 8, wherein the first chip is suitable for receiving the second selection data through the first connection element, is suitable for receiving the third selection data through the second connection element, and the first chip is suitable for converting the first, second and third selection data into serial data and outputting the serial data as transmission data in response to a read signal which is enabled to execute a read operation.

10. The semiconductor system of claim 7, wherein the third chip includes:
   a third failure information generator suitable for generating the third failure information including information on a normality/abnormality of a third memory cell array in response to the first test start signal; and
   a third data output circuit suitable for selectively outputting the third failure information as the third selection data in response to the second test start signal.

11. A semiconductor device comprising:
   a first chip, a second chip and a third chip which are sequentially stacked; and
   a first connection portion and a second connection portion penetrating the first, second and third chips,
   wherein in response to a second test start signal the first chip is suitable for selectively generating first failure information in response to a first test start signal as first selection data,
   wherein in response to the second test start signal the second chip is suitable to selectively generate second failure information in response to the first test start signal as second selection data, and
   wherein in response to the second test start signal the third chip is suitable to selectively generate third failure information in response to the first test start signal as third selection data.

12. The semiconductor device of claim 11, wherein the first chip is suitable for receiving the second selection data through the first connection portion, is suitable for receiving the third selection data through the second connection portion, and the first chip is suitable for converting the first, second and third selection data into serial data and outputting the serial data as transmission data in response to a read signal which is enabled to execute a read operation.

13. The semiconductor device of claim 11, wherein the first chip includes:
   a first failure information generator suitable for generating the first failure information including information on a normality/abnormality of a first memory cell array in response to the first test start signal; and
   a first data output circuit suitable for selectively outputting the first failure information as the first selection data in response to the second test start signal.

14. The semiconductor device of claim 13, wherein the first data output circuit includes:
   a latch circuit suitable for latching the first failure information and suitable for outputting the latched first failure information as a first latch signal in response to the second test start signal; and
   a selection output circuit suitable for selectively outputting the first latch signal or first normal data as the first selection data in response to a selection signal generated in response to the second test start signal.

15. The semiconductor device of claim 14, wherein the first data output circuit further includes a selection signal generator suitable for generating the selection signal in response to the second test start signal while a chip identification signal and a set code are equal.

16. The semiconductor device of claim 13, wherein the first chip further includes:
   a command decoder suitable for decoding a command to generate a read signal which is enabled to execute a read operation; and
   a conversion output circuit suitable for converting the first, second and third selection data into serial data to output the serial data as transmission data in response to the read signal.

17. The semiconductor device of claim 13, wherein the second chip includes:
   a second failure information generator suitable for generating the second failure information including information on a normality/abnormality of a second memory cell array in response to the first test start signal; and
   a second data output circuit suitable for selectively outputting the second failure information as the second selection data in response to the second test start signal.

18. The semiconductor device of claim 17, wherein the third chip includes:
   a third failure information generator suitable for generating the third failure information including information on a normality/abnormality of a third memory cell array in response to the first test start signal; and
   a third data output circuit suitable for selectively outputting the third failure information as the third selection data in response to the second test start signal.

19. A semiconductor device comprising:
   a first chip, a second chip and a third chip which are sequentially stacked; and
   a first connection portion and a second connection portion penetrating the first, second and third chips,
   wherein the first chip is suitable for generating first selection data from first failure information, the second chip is suitable for generating second selection data from second failure information, and the third chip is suitable for generating third selection data from third failure information,
   wherein the first chip is suitable for receiving the second selection data through the first connection portion and is suitable for receiving the third selection data through the second connection portion, and
   wherein the first chip is suitable for converting the first, second and third selection data into serial data and outputting the serial data as transmission data, in response to a read signal which is enabled to execute a read operation.

20. The semiconductor device of claim 19,
   wherein the first failure information includes information on a normality/abnormality of a first memory cell array included in the first chip;
   wherein the second failure information includes information on a normality/abnormality of a second memory cell array included in the second chip; and
   wherein the third failure information includes information on a normality/abnormality of a third memory cell array included in the third chip.

* * * * *